United States Patent
Yi et al.

(10) Patent No.: US 9,349,772 B2
(45) Date of Patent: May 24, 2016

(54) METHODS FOR FABRICATING INTEGRATED CIRCUITS WITH SPIN TORQUE TRANSFER MAGNETIC RANDOM ACCESS MEMORY (STT-MRAM) INCLUDING A PASSIVATION LAYER FORMED ALONG LATERAL SIDEWALLS OF A MAGNETIC TUNNEL JUNCTION OF THE STT-MRAM

(71) Applicant: GLOBALFOUNDRIES Singapore Pte. Ltd., Singapore (SG)

(72) Inventors: Wanbing Yi, Singapore (SG); Yang Hong, Ottobrunn (DE); Yi Jiang, Singapore (SG); Francis Poh, Singapore (SG); Tze Ho Simon Chan, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/261,543

(22) Filed: Apr. 25, 2014

(65) Prior Publication Data
US 2015/0311251 A1 Oct. 29, 2015

(51) Int. Cl.
| | |
|---|---|
| H01L 27/10 | (2006.01) |
| H01L 27/22 | (2006.01) |
| H01L 43/02 | (2006.01) |
| H01L 43/08 | (2006.01) |
| H01L 43/10 | (2006.01) |
| H01L 43/12 | (2006.01) |
| G11C 11/16 | (2006.01) |

(52) U.S. Cl.
CPC .............. *H01L 27/222* (2013.01); *G11C 11/16* (2013.01); *H01L 43/02* (2013.01); *H01L 43/08* (2013.01); *H01L 43/10* (2013.01); *H01L 43/12* (2013.01)

(58) Field of Classification Search
CPC ...................................................... G11C 11/16
See application file for complete search history.

(56) References Cited

U.S. PATENT DOCUMENTS

| | | | | |
|---|---|---|---|---|
| 7,579,197 B1 * | 8/2009 | Li | ........................... | H01L 43/08 257/E21.665 |
| 7,781,231 B2 * | 8/2010 | Li | ........................ | B82Y 25/00 257/295 |

\* cited by examiner

*Primary Examiner* — Howard Weiss
(74) *Attorney, Agent, or Firm* — Ingrassia Fisher & Lorenz, P.C.

(57) ABSTRACT

A method of fabricating an integrated circuit includes depositing a bottom electrode layer, an MTJ layer, and a top electrode layer over a passivation layer and within a trench of the passivation layer and removing portions of the MTJ layer and the top electrode layer to form an MTJ/top electrode stack over the bottom electrode layer and at least partially within portions of the trench having being reopened by said removing. The method further includes forming a further passivation layer over the MTJ/top electrode stack, forming a further ILD layer of the further passivation layer, and reforming a top electrode layer over the ILD layer and over the MTJ/top electrode stack. Still further, the method includes removing portions of the bottom electrode layer, the further passivation layer, the further ILD layer, and the re-formed top electrode layer to form a bottom electrode/MTJ/top electrode stack.

17 Claims, 10 Drawing Sheets

METHODS FOR FABRICATING INTEGRATED CIRCUITS WITH SPIN TORQUE TRANSFER MAGNETIC RANDOM ACCESS MEMORY (STT-MRAM) INCLUDING A PASSIVATION LAYER FORMED ALONG LATERAL SIDEWALLS OF A MAGNETIC TUNNEL JUNCTION OF THE STT-MRAM

TECHNICAL FIELD

The present disclosure generally relates to integrated circuits and methods for fabricating integrated circuits. More particularly, the present disclosure relates to spin torque transfer magnetic random access memory (STT-MRAM) structures in integrated circuits and methods for fabricating the same.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through an underlying channel between the source and drain regions.

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies that store data as electric charge, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between high and low resistance states across the MRAM magnetic layers is typically high. Thus, when multiple cells are arranged in an MRAM array, the programming current directed to one memory cell may induce a field change in the free layer of an adjacent cell. This potential for write disturbances, also known as the "half-select problem," can be addressed using a spin torque transfer technique.

A conventional spin torque transfer MRAM (STT-MRAM) cell may include a magnetic cell stack, which may be a magnetic tunnel junction (MTJ) or a spin valve structure. An MTJ is a magnetoresistive data storing element including two magnetic layers (one pinned and one free) and an insulating layer in between, a bit line, a word line, a source line, and an access transistor. A spin valve has a structure similar to the MTJ, except a spin valve has a conductive layer in between the two magnetic layers. A programming current typically flows through the access transistor and the magnetic cell stack. The pinned layer polarizes the electron spin of the programming current, and torque is created as the spin-polarized current passes through the stack. The spin-polarized electron current interacts with the free layer by exerting a torque on the free layer. When the torque of the spin-polarized electron current passing through the stack is greater than the critical switching current density (JO, the torque exerted by the spin-polarized electron current is sufficient to switch the magnetization of the free layer. Thus, the magnetization of the free layer can be aligned to be either parallel or antiparallel to the pinned layer, and the resistance state across the stack is changed.

The STT-MRAM has advantageous characteristics over the MRAM, because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed. Additionally, STT-MRAM technology allows for a higher tunnel magnetic resistance ratio, meaning there is a larger ratio between high and low resistance states, improving read operations in the magnetic domain.

Presently-known STT-MRAM structures and methods for fabricating such structures all suffer from several drawbacks. For example, in some known structures, a metallization layer over the STT-MRAM structure has a tendency to cross-contaminate the STT-MRAM structure. In other known structures, upon formation of the opening or "trench" for the overlying metallization layer, there may be a tendency of "over-etch," which could potentially cause damage to the STT-MRAM structure.

Accordingly, with the increasing use of STT-MRAM in modern integrated circuits, it is desirable to provide robust and reliable STT-MRAM structures. Additionally, it is desirable to provide methods for the fabrication of such structures that are easily integrated into existing process flow schemes used in semiconductor fabrication facilities. Still further, it is desirable to provide such structures and methods that do not suffer from the aforementioned drawbacks of cross-contamination and over-etch when placing a metallization layer of the STT-MRAM structure. Furthermore, other desirable features and characteristics of the present disclosure will become apparent from the subsequent detailed description and the appended claims, taken in conjunction with the accompanying drawings and the foregoing technical field and background.

BRIEF SUMMARY

Spin torque transfer magnetic random access memory in integrated circuits and methods for fabricating the same are disclosed. In one exemplary embodiment, a method of fabricating an integrated circuit includes forming a trench within a passivation layer, the passivation layer being formed over an ILD layer and a metallization layer with the ILD layer, the trench being formed over at least a portion of the metallization layer, depositing a bottom electrode layer, an MTJ layer, and a top electrode layer over the passivation layer and within the trench, thereby filling the trench, wherein the trench is filled with portions of the bottom electrode layer and portions of the MTJ layer, but is not filled with the top electrode layer, and removing portions of the MTJ layer and the top electrode layer to form an MTJ/top electrode stack over the bottom electrode layer and at least partially within portions of the trench having being reopened by said removing. The method further includes forming a further passivation layer over the MTJ/top electrode stack and within the portions of the trench having been reopened, the passivation layer forming concave structures adjacent to lateral sides of the MTJ/top electrode stack, and reforming a top electrode layer over the further passivation layer and over the MTJ/top electrode stack. Still further, the method includes removing portions of the bottom electrode layer, the further passivation layer, and the re-formed top electrode layer to form a bottom electrode/MTJ/top electrode stack. The bottom electrode/MTJ/top electrode stack comprises a spin torque transfer magnetic random access memory structure.

In another exemplary embodiment, a method of fabricating an integrated circuit includes forming a bottom electrode segment over a passivation layer, the passivation layer being formed over an ILD layer and a metallization layer with the ILD layer, the bottom electrode segment being formed off-axis from the metallization layer, depositing an MTJ layer and a top electrode layer over the bottom electrode segment and over the passivation layer, and removing portions of the MTJ layer and the top electrode layer to form an MTJ/top electrode stack over a portion of the bottom electrode segment, wherein the bottom electrode segment in combination with the MTJ/top electrode stack formed thereover comprises a spin torque transfer magnetic random access memory structure.

In still a further embodiment, an integrated circuit includes an active semiconductor area disposed on a semiconductor substrate, a metallization layer disposed over the active semiconductor area, and a first passivation layer disposed over the metallization layer, wherein the first passivation layer comprises a void region therein, the void region being positioned over the metallization layer. The integrated circuit further includes a bottom electrode disposed within the void region and over the metallization layer, a magnetic tunnel junction (MTJ) structure disposed over the bottom electrode layer and partially within the void region, a top electrode disposed over the MTJ structure. The bottom electrode, the MTJ structure, and the top electrode together form a spin torque transfer magnetic random access memory (STT-MRAM) structure. Still further, the integrated circuit includes a second passivation layer disposed along lateral sides of the STT-MRAM structure and partially within the void region, the second passivation layer forming concave structures adjacent to the lateral sides of the STT-MRAM structure.

In still a further embodiment, an integrated circuit includes an active semiconductor area disposed on a semiconductor substrate, a metallization layer disposed over the active semiconductor area and within an interlayer dielectric layer (ILD), and a passivation layer disposed over the metallization layer and the ILD layer. The integrated circuit further includes a bottom electrode segment disposed over the passivation layer. The bottom electrode segment is formed off-axis from the metallization layer. Still further, the integrated circuit includes a magnetic tunnel junction (MTJ) layer and a top electrode layer over the bottom electrode segment and over the passivation layer. The MTJ layer and the top electrode layer form an MTJ/top electrode stack over a portion of the bottom electrode segment. The bottom electrode segment in combination with the MTJ/top electrode stack formed thereover form a spin torque transfer magnetic random access memory (STT-MRAM) structure.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to spin torque transfer magnetic random access memory (STT-MRAM) integrated circuit structures and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
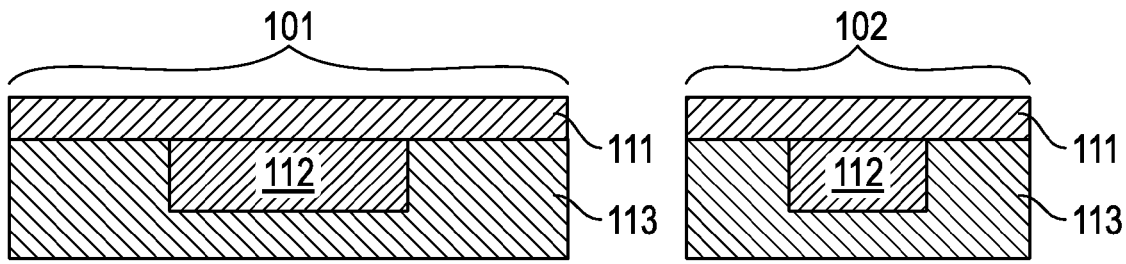
FIGS. 1-14 illustrate, in cross section, STT-MRAM integrated circuit structures and methods for fabricating STT-MRAM integrated circuits in accordance with one embodiment of the present disclosure.

FIGS. 1-14 illustrate, in cross section, STT-MRAM integrated circuit structures and methods for fabricating STT-MRAM integrated circuit structures in accordance with one embodiment of the present disclosure. Each of FIGS. 1-14 illustrate a memory portion 101 of the structure, wherein the STT-MRAM is to be formed, and a logic portion 102 of the integrated circuit structure, wherein memory is not formed. Each portion 101 and 102 of the integrated circuit structure illustrated in FIG. 1 includes an inter-layer dielectric (ILD) layer 113 and a metallization layer 112 within the ILD layer 113. By the term "within," it is meant that a top surface of the metallization layer 112 is substantially coplanar with a top surface of the ILD layer 113, and the metallization layer 112 extends downward into the ILD layer 113, as illustrated in FIG. 1. The ILD layer 113 may be formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8. The metallization layer 112 may be formed of a conductive metal, such as copper or copper alloys. In one particular, non-limiting embodiment, the metallization layer 112 is a fourth metallization layer (M4). One skilled in the art will realize the formation details of the ILD layer 113 and the metallization layer 112.

Though not illustrated for simplicity in FIGS. 1-14, the ILD layer 113 and the metallization layer 112 may be formed over other ILD and/or metallization layers, and also over an active region of a semiconductor substrate forming part of the integrated circuit structure. As used herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The substrate may further include a plurality of isolation features (not shown), such as shallow trench isolation (STI) features or local oxidation of silicon (LOCOS) features. The isolation features may define and isolate the various microelectronic elements (not shown), also referred to herein as the aforesaid active regions. Examples of the various microelectronic elements that may be formed in the substrate include transistors (e.g., metal oxide semiconductor field effect transistors (MOSFET): bipolar junction transistors (BJT); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device, radio frequency (RF) device, input/output (I/O) device, system-on-chip (SoC) device, combinations thereof, or other suitable types of devices.

As further illustrated in FIG. 1, both regions 101 and 102 include a passivation layer 111 formed over the aforesaid top surface of the metallization layer 112 and the ILD layer 113. The passivation layer 111 may be formed of a non-organic material selected from un-doped silicate glass (USG), silicon nitride, silicon oxynitride, silicon oxide, or combinations thereof. In some alternative embodiments, the passivation layer 111 is formed of a polymer layer, such as an epoxy, polyimide, benzocyclobutene (BCB), polybenzoxazole (PBO), or the like, although other relatively soft, often organic, dielectric materials may also be used.

In a specific, non-limiting embodiment, the passivation layer 111 may be formed of a silicon carbide-based passivation material layer including nitrogen. In one example, silicon carbide with nitrogen deposited using chemical vapor deposition (CVD) from a trimethylsilane source, which is commercially available from Applied Materials under the tradename of BLOK®, is used as the layer 111. The compound with less nitrogen (N) (less than about 5 mol %), i.e., $Si_aC_bN_cH_d$, is referred to as "BLOK", and the compound with more N (about 10 mol % to about 25 mol %), i.e., $Si_wC_xN_yH_z$, is referred to as "NBLOK". BLOK has a lower dielectric constant of less than 4.0, whereas NBLOK has a dielectric constant of about 5.0. While BLOK is not a good oxygen barrier but is a good copper (Cu) barrier, NBLOK is both a good oxygen barrier and a good Cu barrier. In an exemplary embodiment, the passivation layer 111 includes an NBLOK material.

Figure 2:
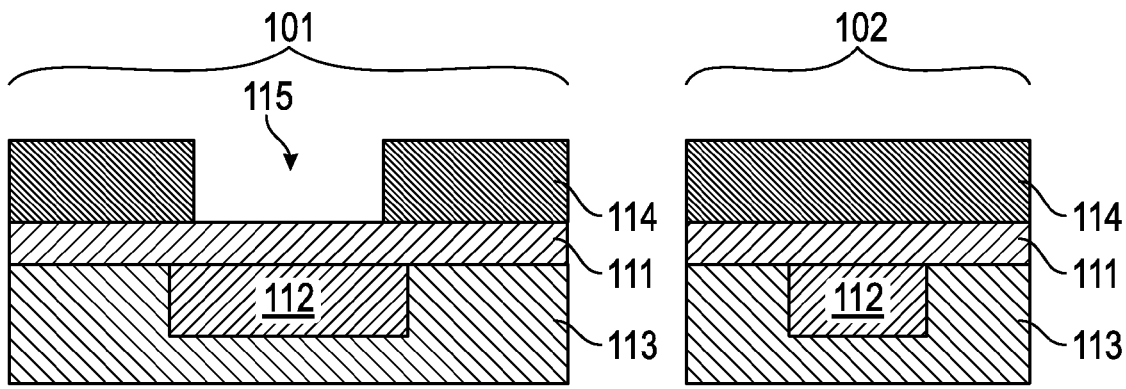
Figure 3:
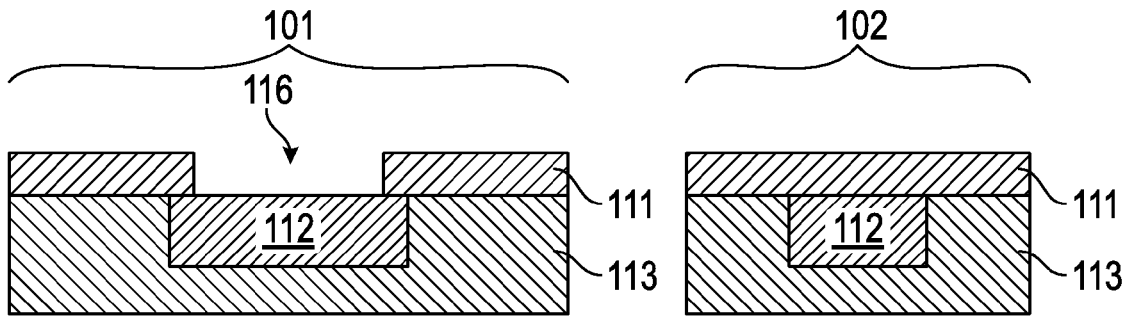

Turning now to FIG. 2, a photoresist material layer 114 is deposited over the passivation layer 111 in both regions 101 and 102. The photoresist material layer 114 is then patterned by exposure to a light source using known photolithographic processes. The patterning is performed so as to remove the photoresist material layer 114 in an area that is generally over the metallization layer 112 in region 101. The patterning process results in a trench 115 formed within the photoresist material layer 114, thereby exposing an upper surface of the passivation layer 111 in the aforesaid area that is generally over metallization layer 112. One or more etching steps are then performed, as shown in FIG. 3, to transfer the pattern into the passivation layer 111, forming a further trench 116 therein, in the area that is generally over the metallization layer 112. As a result of the one or more etching steps, all or a portion of the upper surface of the metallization layer 112 is exposed. The remaining portions of the patterned photoresist layer are then removed (for example by a suitable polishing or planarization process), resulting substantially in the structure illustrated in FIG. 3, having the remaining portions (non-etched) of the upper surface of the passivation layer 111 exposed, along with at least a portion of the upper surface of the metallization layer 112 exposed within the further trench 116.

Figure 4:
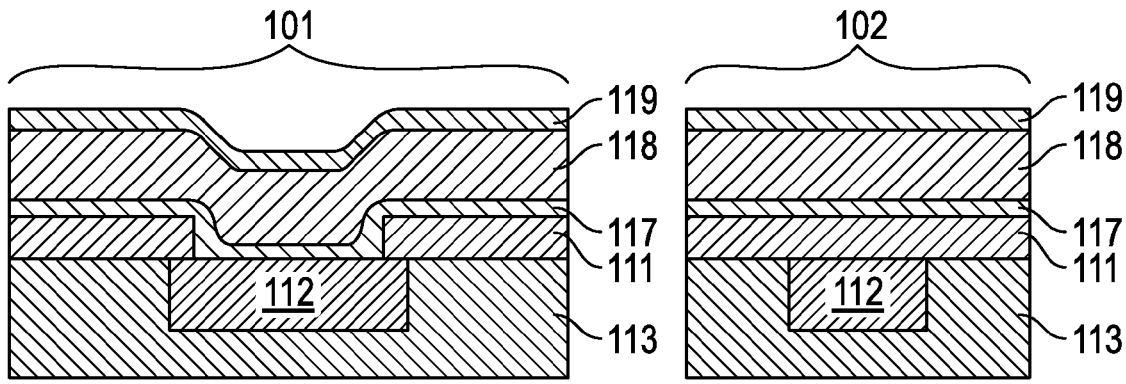

With reference now to FIG. 4, layers 117, 118, and 119 are blanket deposited over the exposed upper surfaces of both the metallization layer 112 within the further trench 116 and the passivation layer 111. Layers 117, 118, and 119 are also deposited over region 102. Regarding the STT-MRAM structure to be formed in region 101, layer 117 is a bottom electrode layer. Bottom electrode layer 117 is formed of a conductive material, such as a metal or a metal alloy. In an embodiment, bottom electrode layer 117 is formed of tantalum. Layer 118 is a magnetic tunnel junction (MTJ) layer. MTJ layer 118 may include various layers formed of different combinations of materials. In an exemplary embodiment, MTJ layer 118 includes a pinning layer, a tunnel barrier layer, and a free layer (these three layers that form the MTJ layer 118 are not separately illustrated for simplicity). In addition, MTJ layer 118 may have other variations including other layers, such as anti-ferro-magnetic layers (also not shown). In an exemplary embodiment, the pinning layer is formed of PtMn, the tunnel barrier layer is formed of MgO, and the free layer is formed of CoFeB. The magnetic moment of free layer may be programmed causing the resistance of the resulting MTJ cell to be changed between a high resistance and a low resistance. It is realized that MTJ layers 118 may have many variations, which are also within the scope of the present disclosure. Layer 119 is a top electrode layer. Top electrode layer 119 is formed of a conductive material, such as a metal or a metal alloy. In an embodiment, top electrode layer 119 is formed of tantalum, tantalum nitride, titanium, and/or other commonly used conductive metals. The thickness of layers 117, 118, and 119 may be selected such that layer 117 is entirely within trench 116, layer 118 is partially within trench 116 and partially extends above trench 116, and layer 119 is entirely above trench 116.

Figure 5:
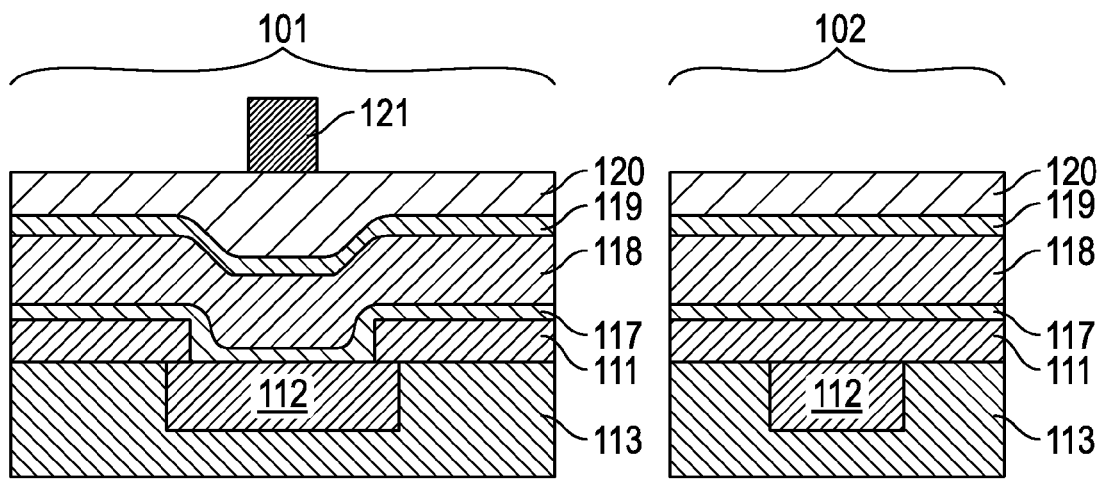

Turning now to FIG. 5, a further ILD layer 120 is deposited over top electrode layer 119 in regions 101 and 102. As with ILD 113, ILD layer 120 may be formed of one or more low-k dielectric materials, un-doped silicate glass (USG), silicon nitride, silicon oxynitride, or other commonly used materials. A photoresist material layer is then deposited and patterned over the ILD layer 120, in the manner previously described with regard to photoresist material layer 114, using a pattern that leaves a segment of photoresist material 121 disposed over the area that is generally over the metallization layer 112 in region 101. Segment 121 may have a width, with respect to an upper surface of ILD layer 120, that is generally less than a width of either the metallization layer 112 or the (formerly present) trench 116, and may be centered over the (formerly present) trench 116.

Figure 6:
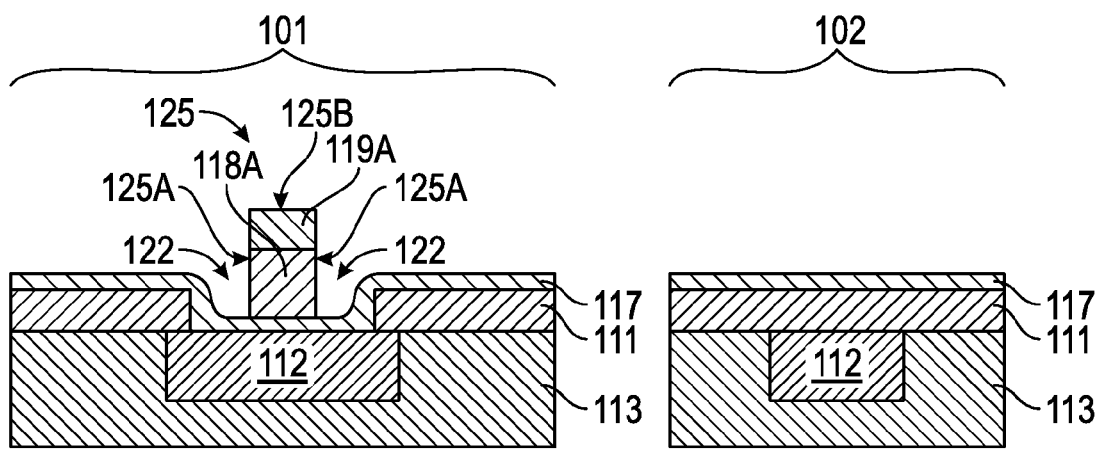

With reference now to FIG. 6, the photoresist segment 121 serves as an etch mask for an anisotropic etching process. The anisotropic etching may be performed on the basis of a known technique, such as for example using tetrafluoromethane ($CF_4$) reactive ion etching (RIE) or hydrogen bromide (HBr). The bottom electrode layer 117 serves as an etch stop layer for the anisotropic etching process. As a result of anisotropic etching, all of the ILD layer 120, top electrode layer 119, and MTJ layer 118 are removed from over the etch stop bottom electrode layer 117, except for the an area within region 101 directly underneath the photoresist material segment 121. Upon subsequent removal of the photoresist segment 121 and the remaining portion of the ILD layer 120 that was directly under the photoresist segment 121, what remains of layers 118 and 119, as shown in FIG. 6, is an MTJ/top electrode "stack" 125 formed over the bottom electrode layer 117, and having the same width as the (formerly present) photoresist segment 121. As previously noted, the segment 121 was centered over the (formerly present) trench 116. Accordingly, the stack 125 is centered, partially within and partially above (note the previous description of the thicknesses of layers 118 and 119), the (formerly present, and now partially reformed) trench 116. For ease of illustration, those portions of the (formerly present) trench 116, that have been re-formed as a result of the described anisotropic etching, and present on either side of the stack 125 over bottom electrode layer 117, will be referred to as void regions 122.

The stack 125 may be defined by an MTJ segment 118A disposed over the bottom electrode layer 117 and positioned partially within and partially above the (formerly present) trench 116, now shown as void spaces 122. The stack 125 further includes a top electrode segment 119A, formed directly over the MTJ segment 118A. The stack 125 includes two lateral sides 125A, against which the void spaces 122 are present. The stack 125 also includes a top surface 125B, which is a portion of the top portion of the (formerly present) top electrode layer 119.

Figure 7:
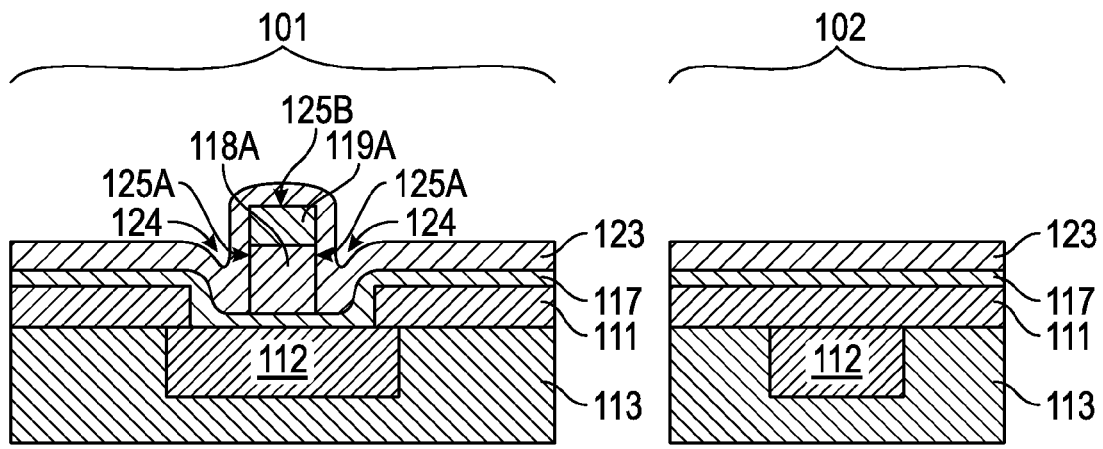

With reference now to FIG. 7, a further passivation layer 123 is conformally deposited over the regions 101 and 102. Within region 101, the passivation layer 123 is deposited within the void regions 122, along the lateral sides 125A of the stack 125, and over the top surface 125B of the stack 125. The thickness of the passivation layer 123 may be selected such that the passivation layer 123 fully fills the void regions 122, but, above the (formerly present) void regions 122, leaves two "concave formations" 124 adjacent to portions of the passivation layer disposed along either lateral side 125A of the stack 125, as shown in FIG. 7. As with passivation layer 111, passivation layer 123 may be formed of a non-organic material selected from un-doped silicate glass (USG), silicon nitride, silicon oxynitride, silicon oxide, or combinations thereof. In some alternative embodiments, the passivation layer 111 is formed of a polymer layer, such as an epoxy, polyimide, benzocyclobutene (BCB), polybenzoxazole (PBO), or the like, although other relatively soft, often organic, dielectric materials can also be used.

Figure 8:
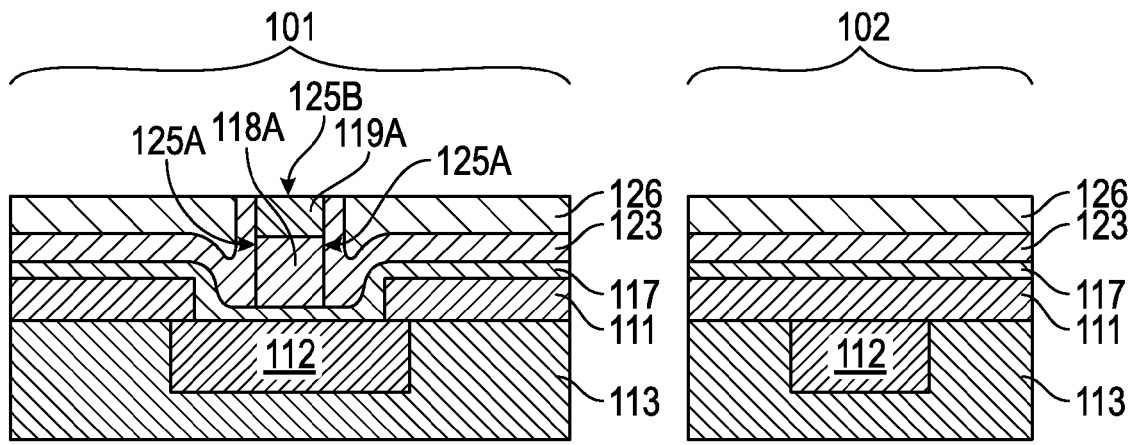

Referring now to FIG. 8, a further ILD layer 126 may be blanket deposited over the passivation layer 123 within the regions 101 and 102. Within region 101, the ILD layer 126 is deposited within the concave formations 124, along the lateral sides 125A of the stack 125, and over the top surface 125B of the stack 125. The thickness of the ILD layer 126 may be selected such that the ILD layer 126 fully fills the concave formations 124. Subsequently, a planarization step may be performed to remove all of the layers 123 and 126 that are above the top surface 125B of stack 125. Accordingly, as shown in FIG. 8, what remains is the stack 125 formed over the metallization layer 112 and over the bottom electrode layer 117, the passivation layer 123 formed over the bottom electrode layer 117 and along the lateral sides 125A of the stack 125, thereby forming the concave formations 124, and the ILD layer 126 formed over the passivation layer 123 and within the concave formations 124.

Figure 9:
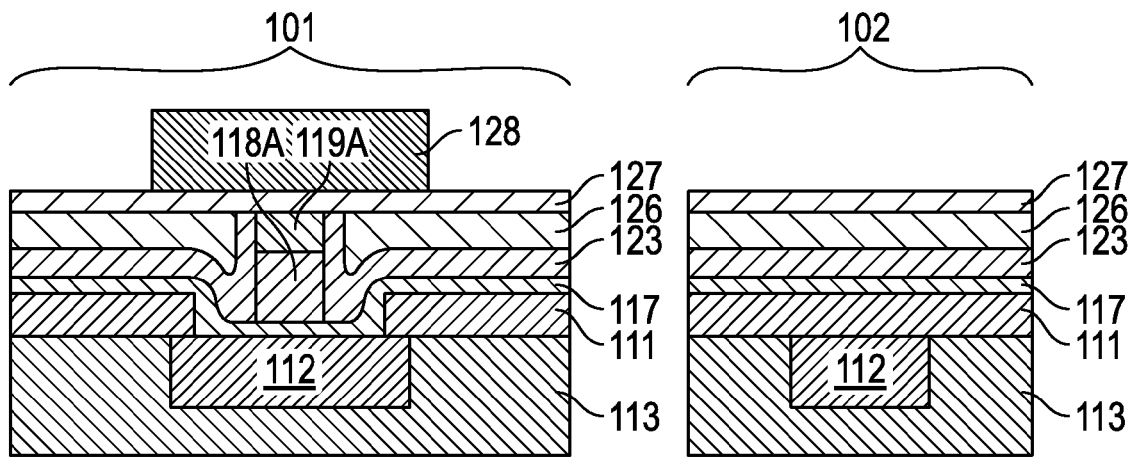

With reference now to FIG. 9, over the top surface 125B of the stack 125 and over the ILD layer 126, the top electrode layer is reformed as layer 127. Layer 127 may be of the same material as (formerly present) top electrode layer 119, which remains in the illustrated structure only as segment 119A. In this manner, layer 127 and segment 119A may form a continuous top electrode structure.

With continued reference to FIG. 9, a further photoresist material layer is then patterned over the re-formed top electrode layer 127, in the manner previously described with regard to photoresist material layer 114, using a pattern that leaves a segment of photoresist material 128 disposed over the aforesaid area that is generally over the metallization layer 112 in region 101. Segment 128 may have a width, with respect to an upper surface of re-formed top electrode layer 127, that is generally greater than either the width of the metallization layer 112 or the (formerly present) trench 116, and may be centered over the (formerly present) trench 116.

Figure 10:
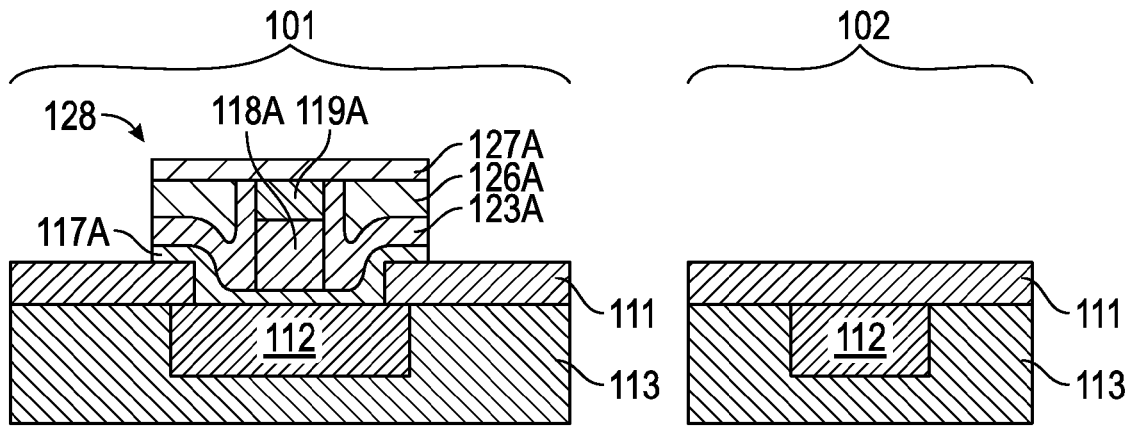

With reference now to FIG. 10, the photoresist segment 128 serves as an etch mask for an anisotropic etching process. The anisotropic etching may be performed on the basis of a known technique, such as for example using tetrafluoromethane ($CF_4$) reactive ion etching (RIE) or hydrogen bromide (HBr). The passivation layer 111 serves as an etch stop layer for the anisotropic etching process. As a result of anisotropic etching, all of the re-formed top electrode layer 127, the ILD layer 126, the passivation layer 123, and the bottom electrode layer 117 are removed from over the etch stop passivation layer 111, except for the an area within region 101 directly underneath the photoresist material segment 128. Upon subsequent removal of the photoresist segment 128, what remains of layers 127, 126, 123, and 117, as shown in FIG. 10, is a bottom electrode/MTJ/top electrode "stack" 128 formed over the metallization layer 112, and having the same width as the (formerly present) photoresist segment 128. As previously noted, the segment 128 was centered over the (formerly present) trench 116. Accordingly, the stack 128 is centered, partially within and partially above the (formerly present) trench 116, and having a width that is greater than both the (formerly present) trench 116 and the metallization layer 112.

The stack 125 may be defined by segments 118A and 119A, as described above, in addition to a bottom electrode segment 117A formed over the metallization layer 112, a passivation layer segment 123A formed over the segment 117A, an ILD segment 126A formed over the segment 123A, and a re-formed top electrode segment 127A formed over the segment 126A. The stack 128 includes two lateral sides 128A and a top surface 128B, which is also the top surface of the re-formed top electrode segment 127A.

Figure 11:
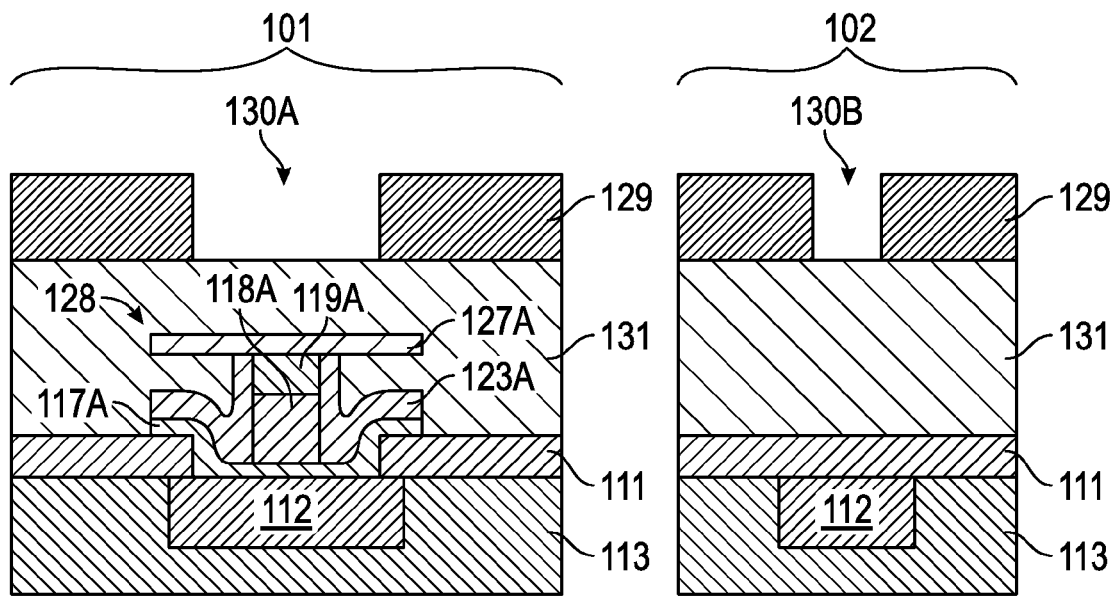
Figure 12:
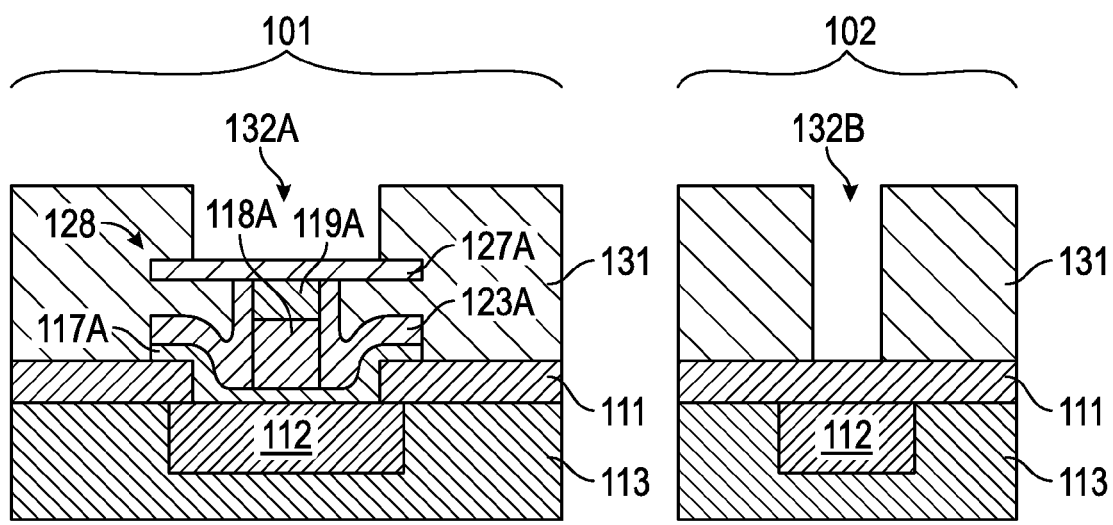

With reference now to FIG. 11, a further ILD layer 131 is blanket deposited within regions 101 and 102. Within region 101, the ILD layer 131 is formed over the passivation layer 111, along the lateral sides 128A of the stack 128, and over the top surface 128B of the stack 128. A photoresist material layer 129 is then deposited over the ILD layer 131 in both regions 101 and 102. The photoresist material layer 129 is then patterned by exposure to a light source using known photolithographic processes. The patterning is performed so as to expose the photoresist material layer 129, with regard to both regions 101 and 102, in an area that is generally over the metallization layer 112. The patterning process results in trenches 130A and 130B formed within the photoresist material layer 129 in regions 101 and 102, respectively, thereby exposing an upper surface of the ILD layer 131 in the aforesaid areas that are generally over metallization layer 112. One or more etching steps are then performed, as shown in FIG. 12, to transfer the pattern into the ILD layer 131, forming further trenches 132A and 132B therein in regions 101 and 102, respectively, in the areas that are generally over the metallization layer 112. The etching is performed in region 101 so as to stop on the re-formed top electrode segment 127A, and the etching is performed in region 102 so as to stop on the passivation layer 111. As a result of the one or more etching steps, all or a portion of the aforesaid upper surface 128B of the stack 128 is exposed in region 101, whereas a portion of the passivation layer in region 102 is exposed thereby. It is noted that the depth of etching in region 102 is greater than the depth of etching in region 101. The remaining portions of the patterned photoresist layer are then removed (for example by a suitable polishing or planarization process), resulting substantially in the structure illustrated in FIG. 12, having the upper surface 128B exposed within trench 132A, and the passivation layer 111 exposed within trench 132B.

Figure 13:
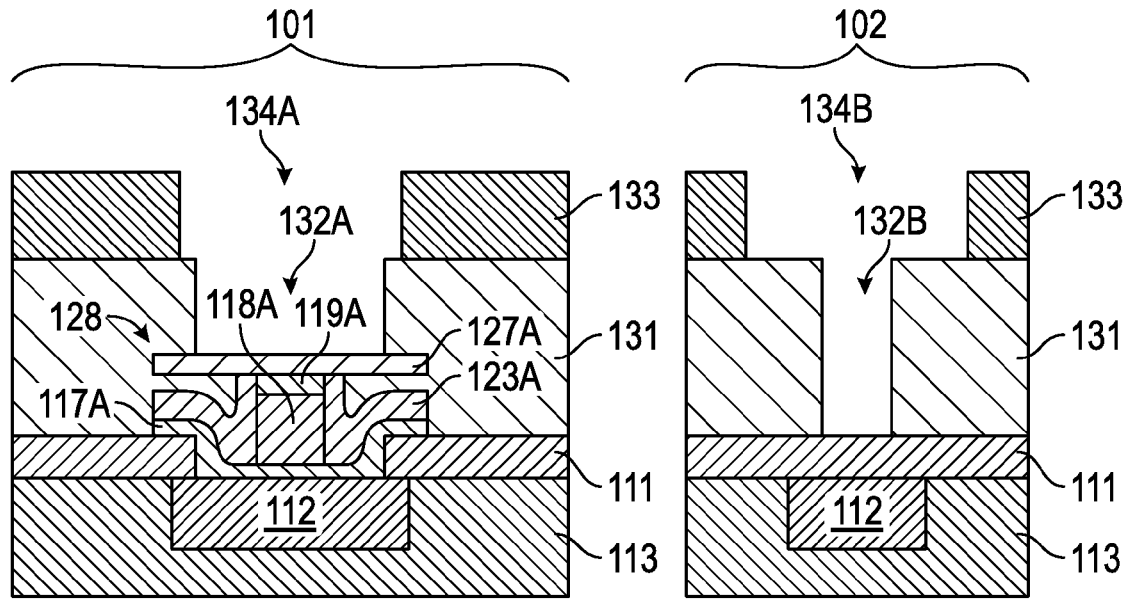
Figure 14:
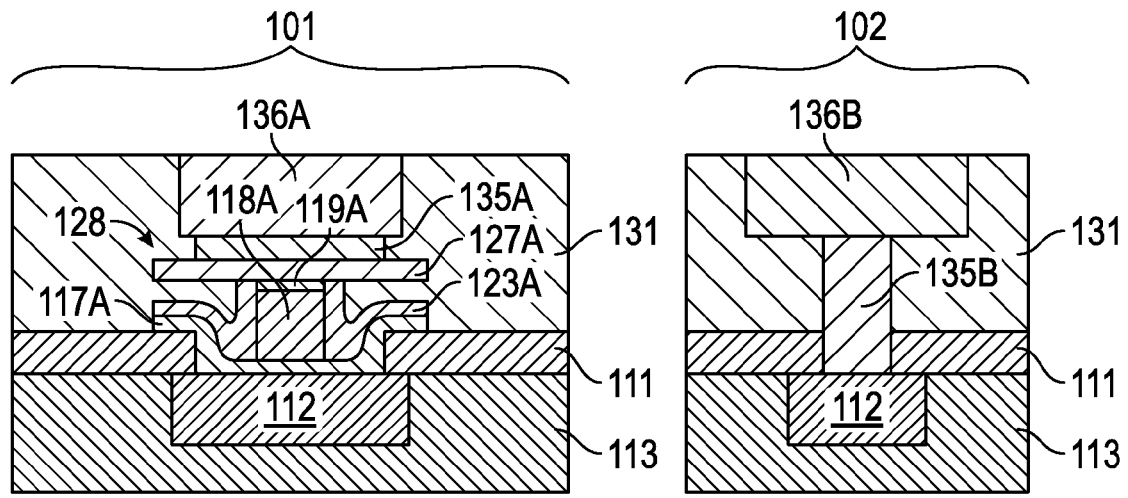

With reference now to FIGS. 13 and 14, the trenches 132A and 132B have been formed for the purposes of forming a via with the ILD layer 131 to the stack 128 in region 101, and to the metallization layer 112 in the region 102. Vias 135A and 135B in regions 101 and 102, respectively, may be formed by the deposition of a conductive material in the trenches 132A and 132B. The conductive material may be any type commonly used in the fabrication of via structures, including but not limited to copper-containing materials. The via 135A directly contacts with the stack 128, and the via 135B directly contacts with the metallization layer 112. In the specific embodiment discussed above wherein the metallization layer 112 is a fourth metallization layer (M4), the vias 135A and 135B are fourth layer vias (V4). In one embodiment, the vias 135A and 135B may be formed simultaneously. Any overdeposition of conductive material to fill the trenches 132A, 132B, may be subsequently removed using a known etching, planarization, or polishing technique (or combination thereof).

With continued reference to FIGS. 13 and 14, an additional photoresist layer 133 may be deposited and patterned in the same manner as described above, with openings 134A and 134B being centered on, but wider than, trenches 132A and 132B, respectively. Subsequent etching within openings 134A and 134B of photoresist material layer 133 (i.e., etching in to the ILD layer 131) is performed to a depth that is sufficient to form a further metallization layer 136 (shown as metallization layer segments 136A and 136B in regions 101 and 102, respectively) upon deposition of a conductive material. Like metallization layer 112, metallization layer 136 may be formed of a conductive metal, such as copper or copper alloys, using known deposition processes. Metallization layer 136 is thus formed in direct contact with the vias 135A and 135B, within ILD layer 131. As shown in FIG. 14, subsequent removal of the photoresist layer 133 and planarization results in a planar surface formed of both the metallization layer 136 and the ILD layer 131. In the specific, non-limiting embodiment discussed above wherein the metallization layer 112 is a fourth metallization layer (M4), the metallization layer 136 is a fifth metallization layer (M5).

Thereafter, the integrated circuit may be completed using known "middle-end-of-the-line" (MEOL) processes and "back-end-of-the-line" (BEOL) processes. The present disclosure is not intended to exclude any such further processes as are conventional in the fabrication of conventional integrated circuits and semiconductor chips.

Figure 15:
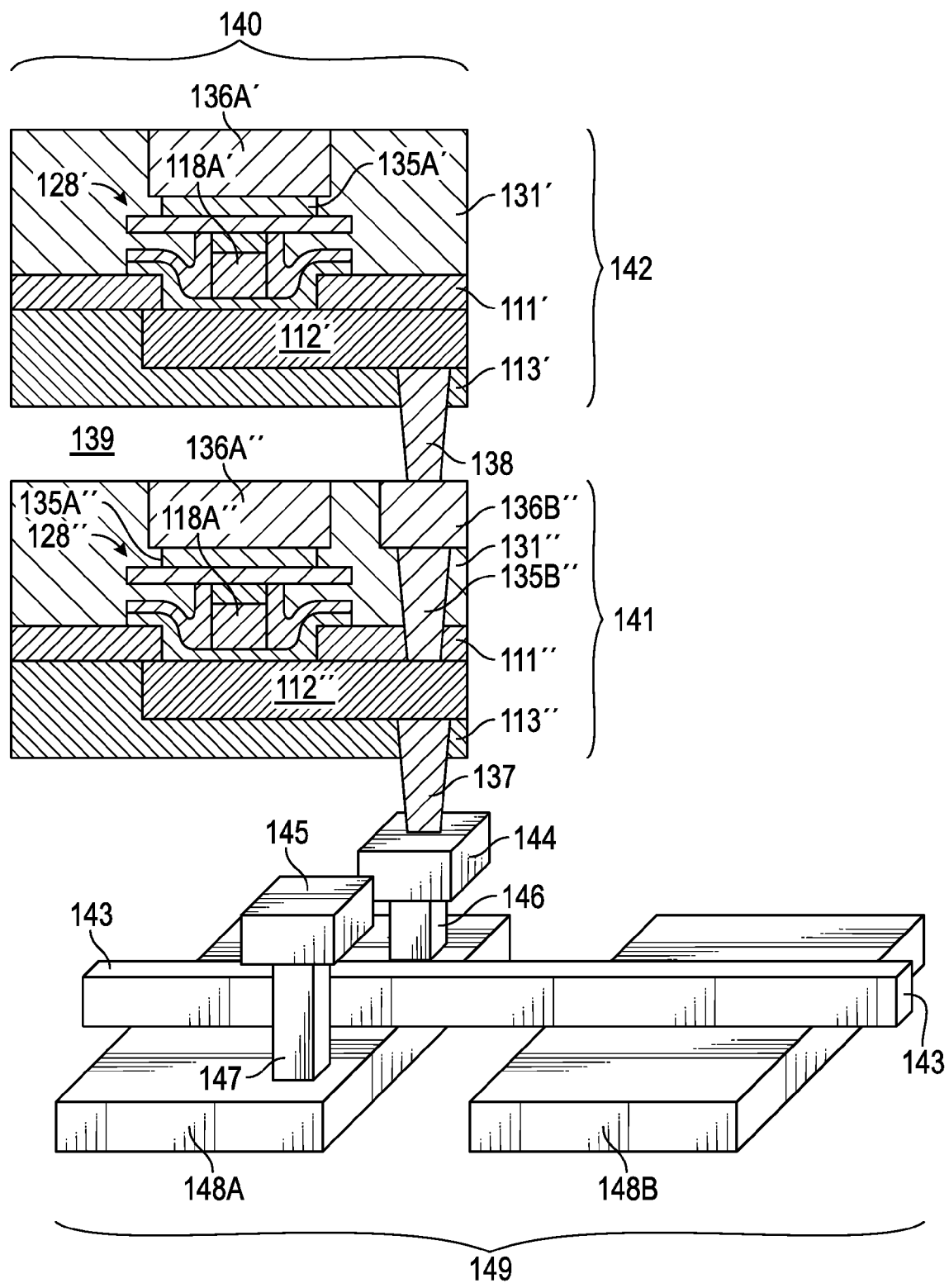
FIG. 15 illustrates an STT-MRAM integrated circuit structure fabricated in accordance with the exemplary method shown in FIGS. 1-14.
Figure 16:
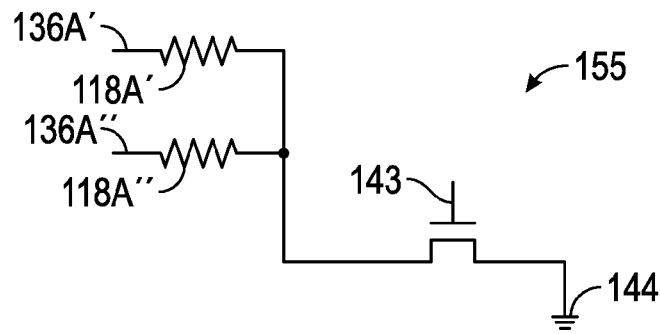
FIG. 16 is a circuit diagram of the STT-MRAM integrated circuit structure of FIG. 15.

FIG. 15 illustrates an STT-MRAM integrated circuit structure fabricated in accordance with the exemplary method shown in FIGS. 1-14, and FIG. 16 is a circuit diagram of the STT-MRAM integrated circuit structure of FIG. 15. As shown in FIG. 15, multiple STT-MRAM structures may be formed in a "stacked" configuration. In one exemplary embodiment, FIG. 15 may show a first STT-MRAM structure 141 (the reference numerals thereof corresponding to FIGS. 1-14 with a single-prime marking) between metallization layers M2 and M3 (second and third metallization layers), and a second STT-MRAM structure 142 (the reference numerals thereof corresponding to FIGS. 1-14 with a double-prime marking) between metallization layers M4 and M5 (fourth and fifth metallization layers). A via structure 138, formed within an ILD layer 139, connects M3 with M4.

The STT-MRAM structures 141 and 142 connect with an "active" region of the integrated circuit using a via 137 from M2 to a source line (SL) 144. The exemplary active regions 149, as will be well-understood by those having ordinary skill in the art, includes the SL 144, a wordline (WL) connecting a plurality of active regions 148A and 148B of the integrated circuit, and a plurality of contacts formed from the active regions (e.g., 148A as shown) to the first metallization layer (M1) 145 and the SL 144. Such integrated circuit structure as shown in FIG. 15 results in a circuit, the functionality of which is illustrated by the circuit diagram 155 in FIG. 16 using like reference numerals to illustrate the components of the circuit.

Figure 17:
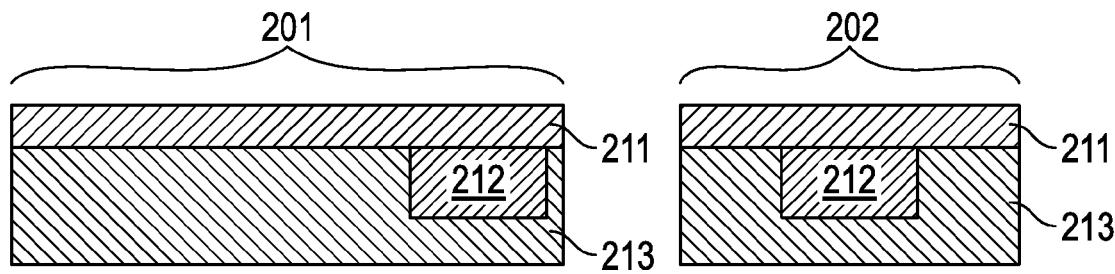
FIGS. 17-25 illustrate, in cross section, STT-MRAM integrated circuit structures and methods for fabricating STT-MRAM integrated circuits in accordance with another embodiment of the present disclosure.
Figure 18:
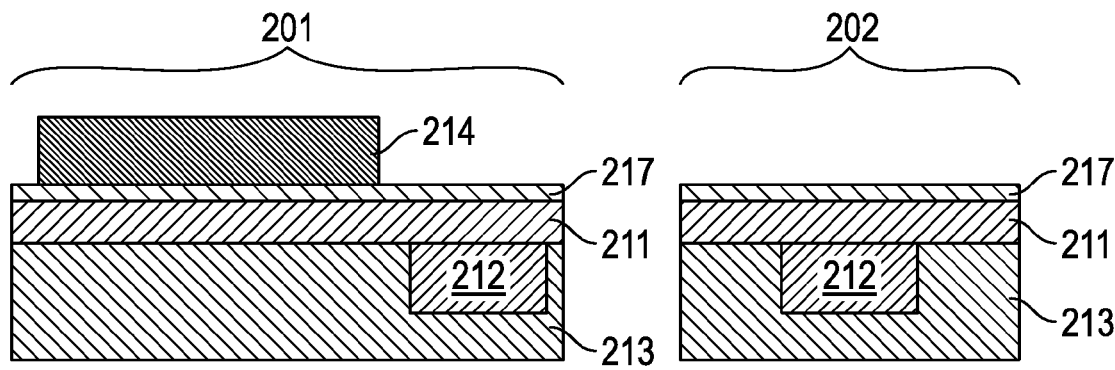
Figure 19:
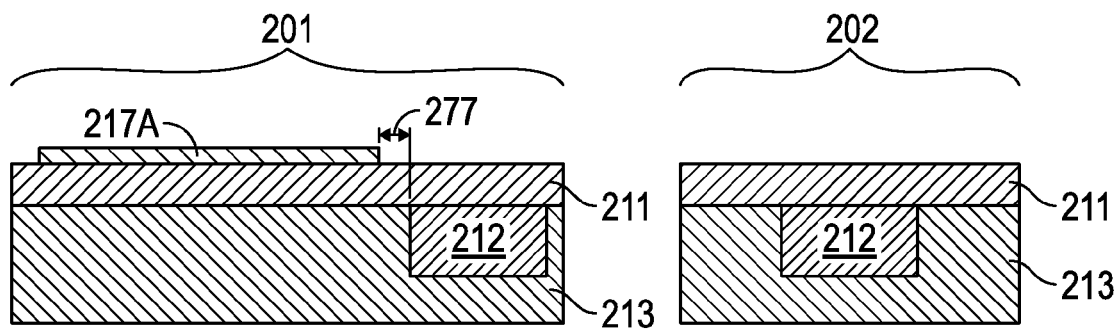
Figure 20:
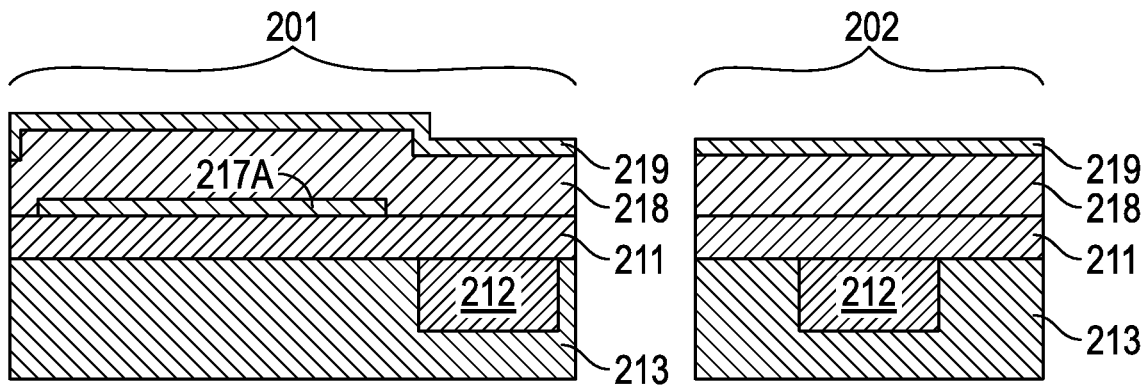

FIGS. 17-25 illustrate, in cross section, STT-MRAM integrated circuit structures and methods for fabricating STT-MRAM integrated circuits in accordance with another embodiment of the present disclosure. In order to avoid duplication of description, only the differences between the embodiments shown in FIGS. 1-14 as compared to FIGS. 17-25 will be described. Further, reference numerals are incremented by 100 for like elements between embodiments for ease of understanding. FIG. 17 illustrates the structure substantially as described with regard to FIG. 1. As shown in FIG. 18, the bottom electrode layer 217 is the deposited directly on to the passivation layer 211, as opposed to being deposited within a trench (116) of the passivation layer as was described above with regard to FIG. 4. A photoresist segment 214 is then provided over the bottom electrode layer 217, which, upon subsequent anisotropic etching, using passivation layer 211 as the etch stop, results in a bottom electrode segment 217A formed on the passivation layer 211. The patterning of the photoresist material, as shown in FIGS. 18 and 19, is performed such that the bottom electrode segment 217A is "off-axis" with respect to the metallization layer 212. By off-axis, it is meant that no part of the metallization layer 212 lies directly underneath the bottom electrode segment 217A. In the configuration of FIG. 19, for example, there is a small distance of lateral separation 277 between the metallization layer 212 and the bottom electrode segment 217A. Thereafter, forming the MTJ layer 218 and the top electrode layer proceeds as described above in FIG. 4, with deposition thereof occurring over the bottom electrode segment 217A and the passivation layer 211, as shown in FIG. 20.

Figure 21:
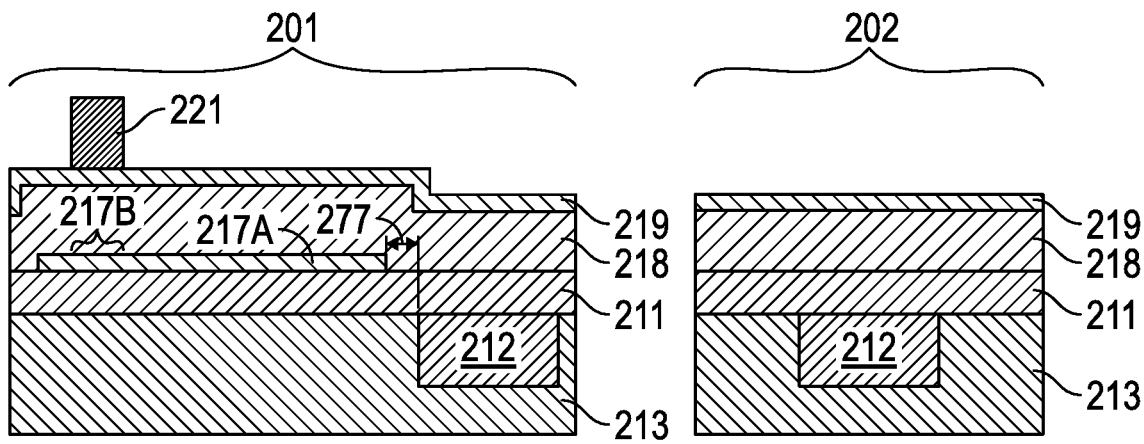
Figure 22:
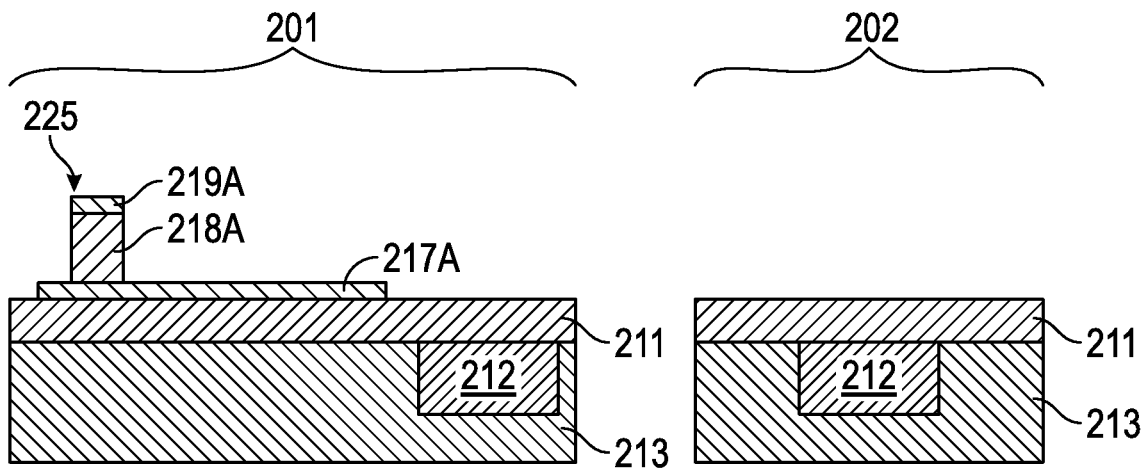

Thereafter, turning now to FIGS. 21 and 22, the stack 225 (formed of MTJ segment 218A and top electrode segment 219A) is formed using anisotropic etching and a further photoresist segment 221, in a manner substantially as described above with regard to FIGS. 5 and 6. The stack, having a width that is less than the width of bottom segment 217A, is formed over a portion 217B of segment 217A, again off-axis from the metallization layer 212.

Figure 23:
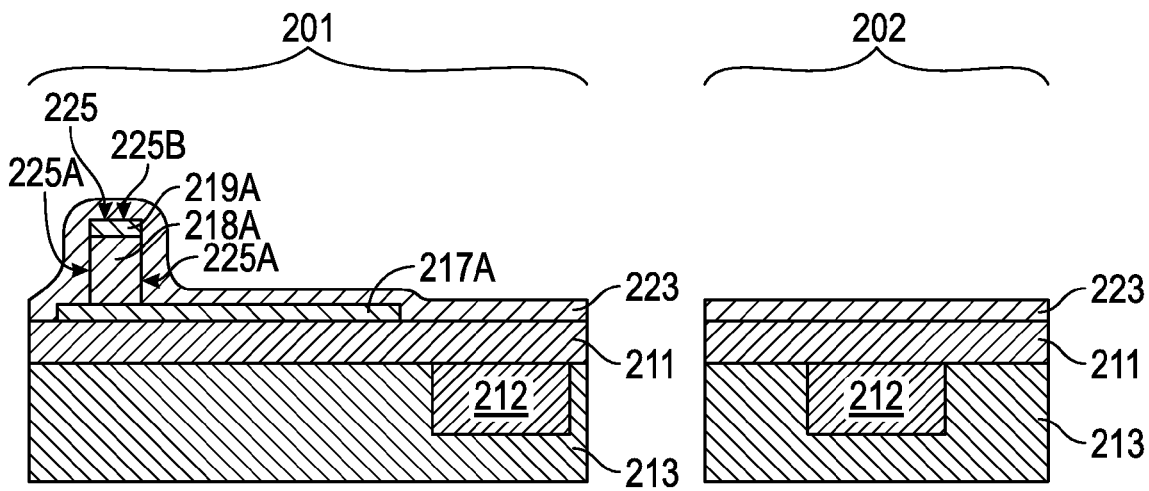
Figure 24:
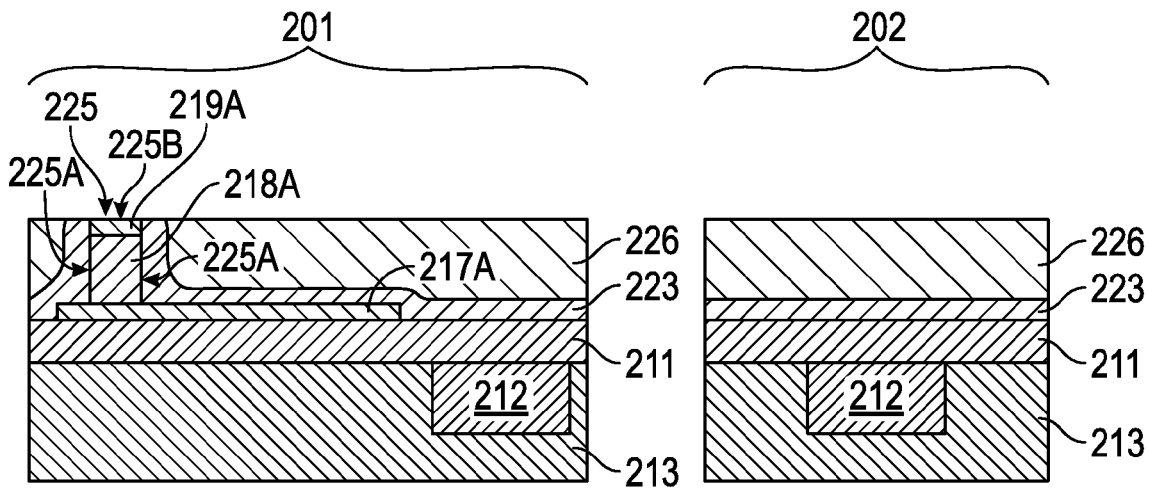

Thereafter, FIGS. 23 and 24 describe processes substantially as set forth above with regard to FIGS. 7 and 8, including the deposition of the further passivation layer 223 and the ILD layer 226, and subsequent planarization of layers 223 and 226. Note that, with the stack not being in the trench 116 and having void spaces 122 along lateral sides thereof, a concave formation is not formed.

Figure 25:
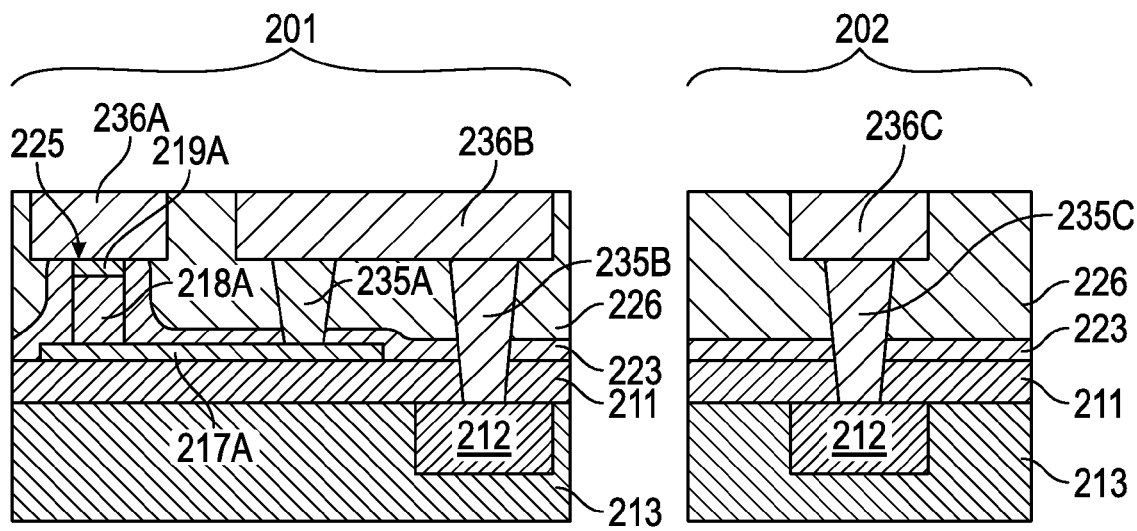

The description of this additional embodiment concludes, as shown in FIG. 25, with the formation of vias 235A-C. Via 235A joins metallization layer 236 to the bottom electrode segment 217A away from the stack 225. Via 235B joins metallization layer 236 to metallization layer 212 in region 201. Further, via 235C joins metallization layer 236 to metallization layer 212 in region 202. An additional via may be present (not illustrated) connecting metallization layer 236 with stack 225, or metallization layer 236 may connect directly with stack 225 as shown in FIG. 25. Thereafter, additional MEOL and BEOL processes may be performed to complete the integrated circuit structure.

Figure 26:
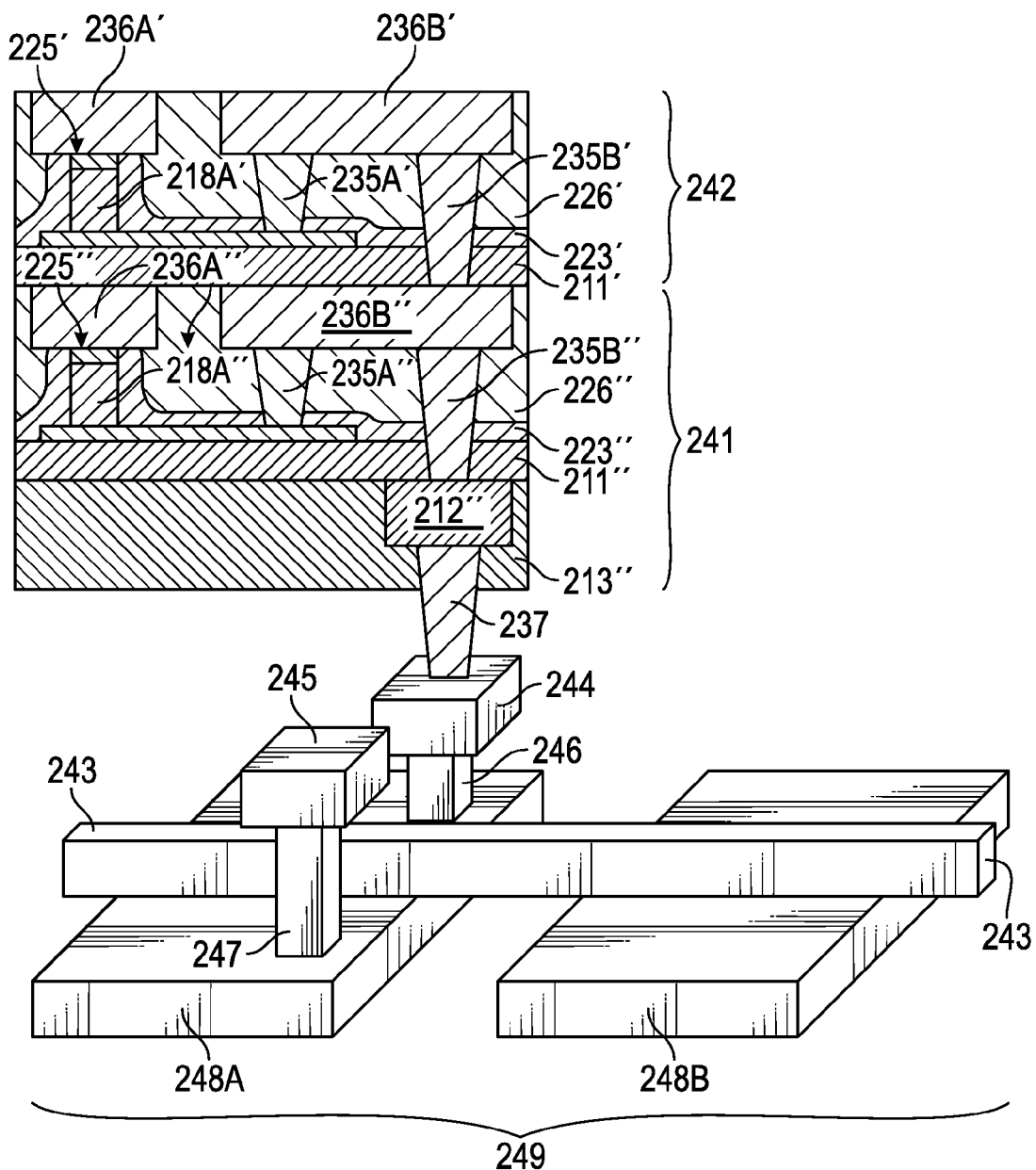
FIG. 26 illustrates an STT-MRAM integrated circuit structure fabricated in accordance with the exemplary method shown in FIGS. 17-25.
Figure 27:
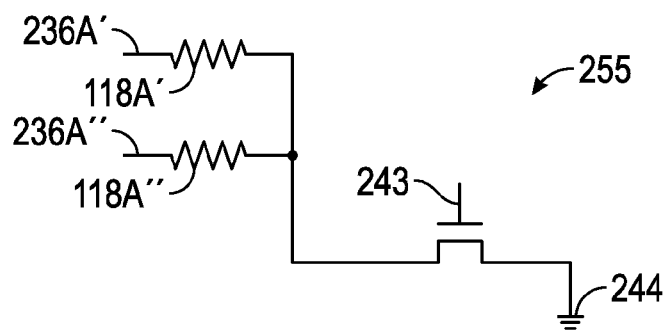
FIG. 27 is a circuit diagram of the STT-MRAM integrated circuit structure of FIG. 26.

FIG. 26 illustrates an STT-MRAM integrated circuit structure fabricated in accordance with the exemplary method shown in FIGS. 17-25 and FIG. 27 is a circuit diagram 255 of the STT-MRAM integrated circuit structure of FIG. 26. As shown therein, the structure of active regions 249 is substantially the same as shown and described above with regard to FIG. 15, with STT-MRAM structures 241 and 242, formed in accordance with FIGS. 17-25, being provided thereabove between the various metallization layers of the integrated circuit.

Accordingly, novel STT-MRAM structures and methods for fabricating the same have been disclosed. The disclosed embodiments provide robust and reliable STT-MRAM structures. Additionally, the disclosed embodiments provide methods for the fabrication of such structures that are easily integrated into existing process flow schemes used in semiconductor fabrication facilities. Still further, the disclosed embodiments provide such structures and methods that do not suffer from the aforementioned drawbacks of cross-contamination and over-etch when placing a metallization layer of the STT-MRAM structure.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of fabricating an integrated circuit comprising:
    forming a trench within a passivation layer, the passivation layer being formed over an interlayer dielectric (ILD) layer and a metallization layer within the ILD layer, the trench being formed over at least a portion of the metallization layer;
    depositing a bottom electrode layer, a magnetic tunnel junction (MTJ) layer, and a top electrode layer over the passivation layer and within the trench, thereby filling the trench, wherein the trench is filled with portions of the bottom electrode layer and portions of the MTJ layer, but is not filled with the top electrode layer;
    removing portions of the MTJ layer and the top electrode layer to form an MTJ/top electrode stack over the bottom electrode layer and at least partially within portions of the trench having being reopened by said removing, wherein an entirety of the bottom electrode layer remains in place during and subsequent to the step of removing portions of the MTJ layer and the top electrode layer;
    forming a further passivation layer over and in physical contact with an upper surface and with lateral sides of the MTJ/top electrode stack and within the portions of the trench having been reopened, the passivation layer forming and comprising concave structures adjacent to the lateral sides of the MTJ/top electrode stack, wherein the step of forming the further passivation layer is performed after the step of removing portions of the MTJ layer and the top electrode layer to form the MTJ/top electrode stack;
    re-forming a top electrode layer over the further passivation layer and over the MTJ/top electrode stack; and
    removing portions of the bottom electrode layer, the further passivation layer, and the re-formed top electrode layer to form a bottom electrode/MTJ/top electrode stack, wherein the step of removing portions of the bottom electrode layer, the further passivation layer, and the re-formed top electrode layer to form a bottom electrode/MTJ/top electrode stack is performed after the step of re-forming the top electrode layer, wherein the bottom electrode/MTJ/top electrode stack comprises a spin torque transfer magnetic random access memory (STT-MRAM) structure.

2. The method of claim 1, wherein forming the trench within the passivation layer comprises forming the trench within a passivation layer comprising a silicon carbide-based passivation material including nitrogen.

3. The method of claim 1, wherein forming the trench within the passivation layer comprises forming the trench such that an entirety of the trench is over the metallization layer.

4. The method of claim 1, wherein depositing the bottom electrode layer comprises depositing a layer of a tantalum material.

5. The method of claim 1, wherein depositing the MTJ layer comprises depositing a pinning layer, a tunnel barrier layer, and a free layer.

6. The method of claim 1, wherein depositing the top electrode layer comprises depositing a layer of a tantalum material or a titanium material.

7. The method of claim 1, wherein forming the further passivation layer comprises depositing a non-organic material selected from the group consisting of: un-doped silicate glass (USG), silicon nitride, silicon oxynitride, silicon oxide, and combinations thereof.

8. The method of claim 1, wherein re-forming the top electrode layer comprises depositing a layer of a tantalum material or a titanium material.

9. The method of claim 1, further comprising forming a further ILD layer over the STT-MRAM structure.

10. The method of claim 1, further comprising forming a via to the STT-MRAM structure and a further metallization layer over the via, the via connecting the STT-MRAM structure to the further metallization layer.

11. A method of fabricating an integrated circuit formed on a semiconductor substrate comprising:

forming a bottom electrode segment over a passivation layer, the passivation layer being formed over an interlayer dielectric (ILD) layer and a metallization layer within the ILD layer, the bottom electrode segment being formed off-axis from the metallization layer, wherein forming the bottom electrode segment off-axis over the passivation layer comprises forming the bottom electrode segment such that no part of the metallization layer lies directly underneath the bottom electrode segment when the integrated circuit is viewed in a cross-section taken through a plane perpendicular to a surface of the semiconductor substrate;

depositing a magnetic tunnel junction (MTJ) layer and a top electrode layer over the bottom electrode segment and over the passivation layer;

removing portions of the MTJ layer and the top electrode layer to form an MTJ/top electrode stack over a portion of the bottom electrode segment, wherein an entirety of the MTJ/top electrode stack lies directly over the bottom electrode segment when the integrated circuit is view in a cross-section taken through the plane perpendicular to the surface of the semiconductor substrate, wherein a width of the MTJ/top electrode stack with respect to a direction parallel to the surface of the semiconductor substrate is less than a width of the bottom electrode segment in the direction parallel to the surface of the semiconductor substrate, and wherein the bottom electrode segment in combination with the MTJ/top electrode stack formed thereover comprises a spin torque transfer magnetic random access memory (STT-MRAM) structure; and forming a further passivation layer over the bottom electrode segment and along lateral sides of the MTJ/top electrode stack.

12. The method of claim 11, wherein forming the bottom electrode segment over the passivation layer comprises forming the bottom electrode segment over a passivation layer comprising a silicon carbide-based passivation material including nitrogen.

13. The method of claim 11, wherein depositing the bottom electrode segment comprises depositing a layer of a tantalum material.

14. The method of claim 11, wherein depositing the MTJ layer comprises depositing a pinning layer, a tunnel barrier layer, and a free layer.

15. The method of claim 11, wherein depositing the top electrode layer comprises depositing a layer of a tantalum material or a titanium material.

16. The method of claim 11, further comprising forming a further ILD layer over the further passivation layer.

17. The method of claim 11, further comprising forming a first via to the bottom electrode segment of the STT-MRAM structure and a further metallization layer over the via, the first via connecting the STT-MRAM structure to the further metallization layer, and further forming a second via from the further metallization layer to the metallization layer, the second via connecting the further metallization layer to the metallization layer.

* * * * *